United States Patent [19]

Kanesige et al.

[11] Patent Number: 4,808,113
[45] Date of Patent: Feb. 28, 1989

[54] CONNECTOR FOR FLEXIBLE FLAT CABLE

[75] Inventors: Akira Kanesige, Musashino; Masashi Seto, Zami, both of Japan

[73] Assignee: Molex Incorporated, Lisle, Ill.

[21] Appl. No.: 149,313

[22] Filed: Jan. 28, 1988

[30] Foreign Application Priority Data

Feb. 26, 1987 [JP] Japan .................. 62-028037

[51] Int. Cl.⁴ .................. H01R 9/09; H01R 9/07
[52] U.S. Cl. .................. 439/67; 439/77; 439/83; 439/493; 439/499
[58] Field of Search .................. 439/67, 76–78, 439/83, 493, 495, 499

[56] References Cited

U.S. PATENT DOCUMENTS

| | | | |
|---|---|---|---|
| 4,629,271 | 12/1986 | Awano | 439/493 |
| 4,639,057 | 1/1987 | Daum | 439/493 |
| 4,684,183 | 8/1987 | Kinoshita et al. | 439/77 |
| 4,693,528 | 9/1987 | Asick et al. | 439/83 |
| 4,701,102 | 10/1987 | Mouissie | 439/499 |
| 4,718,859 | 1/1988 | Gardner | 439/493 |

Primary Examiner—Gil Weidenfeld
Assistant Examiner—P. Austin Bradley
Attorney, Agent, or Firm—John W. Cornell; Louis A. Hecht

[57] ABSTRACT

A miniaturized surface mountable connector arrangement for connecting printed circuits on a printed circuit board to another circuit member, such as flat flex cable is provided. Each circuit on the circuit board is provided with at least two spaced apart solder-bearing contact pads. A connector housing having a board engaging surface includes a plurality of stamped metal terminals each having a pair of depending solder contact projections at least one of which depends from board engaging surface. The connector is positioned on the circuit board so that the contact projections engage the contact pads. Upon reflow of the solder material a balanced shock resistant mechanical attachment and electrical connection of the connector to the circuit board is provided. No additional mounting structures are required so the arrangement occupies less board surface area. The arrangement is well suited for robotic assembly operations.

2 Claims, 6 Drawing Sheets

CONNECTOR FOR FLEXIBLE FLAT CABLE

BACKGROUND OF THE INVENTION

The present invention relates to a new and improved miniaturized surface mountable connector for connecting circuits on a printed circuit board to another circuit member. In a preferred embodiment, a new and improved miniaturized connector for electrically connecting the conductors of flat flex cable to printed circuits on a printed circuit board is provided.

Flat flexible cable or flexible printed circuits including parallel spaced electrical conductors disposed between upper and lower planar webs of insulation are known. Connectors for connecting the individual conductors of flat flexible cable to printed circuits on printed circuit boards are also known. Typically, in these connector arrangements an end of the flat flexible cable is pre-stripped so that the top layer of insulation is removed. This leaves the lower layer of insulation and exposed portions of the cable conductors extending along the upper surface of the lower insulative layer. Cable to board connectors for use with flat flexible cable typically include a unitary dielectric housing having a front end with an opening and a rear end with an opening, a lower board engaging surface and a socket extending between said openings. A plurality of metallic terminals are mounted in the housing, corresponding in number and spacing to the cable conductors. Each terminal typically includes a base portion disposed in the rear end of the housing, a pair of upper and lower spaced apart cantilever beams unitary with the base extending forwardly from opposed sides of the base into the socket. The separation between the upper and lower beams of the terminal define an insertion slot for receiving the pre-stripped end of the cable disposed in the socket. In addition, a rear contact portion extends rearwardly from the base of the terminal to provide for electrical engagement with the printed circuit on the printed circuit board.

A connector of this type further includes a cable actuator including a base and a forwardly projecting nose portion with an upper surface adapted to receive the flat flexible cable so that the exposed conductors of the prestripped end portion face away from the upper surface of the nose portion. The cable actuator is moveable toward the board mounted connector housing so that the nose portion of the actuator and the cable end are received into said socket and into said insertion slot defined between the cantilever beams of the terminal. As the nose portion of the actuator is inserted into the insertion slot it effectively pushes the exposed conductors on its surface into electrical engagement of the upper cantilever beams of the terminals within the housing. Typically latch means are provided on the actuator adapted to cooperate with latch recesses on the housing to lock the actuator and cable in mated position to the housing.

Connectors of this type may be fixed to a printed circuit board by soldering the board contact portion of each terminal to a conductive region on a printed circuit board. The terminal is affixed to the underlying printed circuit at a single point. Often a substantial length of the board contact portion extends along the upper surface of the circuit board. Typically the terminal to circuit solder connections are disposed to the rear of the connector housing. In use, the terminals may be easily raised up off the surface of the board if an external force is applied to a mated cable or to the housing. Unfortunately this may cause part of the printed circuit pattern to which the terminal is fixed to be removed from the printed circuit substrate.

In an effort to prevent terminals from rising and removing the underlying portions of the printed circuit pattern from the substrate, prior art connector housings have typically been provided with laterally extending flange members including depending mounting boss projections. The printed circuit board is also provided with mounting apertures which need to be drilled at precise locations in the substrate. Thereafter, the depending mounting projections must be press fitted into the mounting apertures to retain the housing in position on the printed circuit board. Alternate methods of securing a connector housing to a printed circuit board have included the provision of side mounting flanges including an aperture which is aligned with a printed circuit board mounting aperture and fixing members such as a nut and bolt or rivet arrangements are passed through the aligned apertures to permanently mount the connector to the printed circuit board.

These prior art methods of retaining the connector housing onto the printed circuit board have a number of disadvantages. The housing must be broader than the width of the circuits it is intended to overlie. This takes up real estate on the board surface area which could be used for additional circuitry. In addition, extra manufacturing steps are required to fix the connector housing to the printed circuit board and extra steps are required to provide mounting apertures in the printed circuit board. All of these requirements increase the manufacturing cost of the prior art connector arrangements. Moreover, these mounting arrangements do not meet the modern demand for increasing miniaturization of the connectors and for high density circuit boards having increased surface area utilized for bearing circuit patterns.

SUMMARY OF THE INVENTION

In order to overcome the deficiencies in prior art connector-to-board mounting arrangements, it is an object of the present invention to provide a surface mountable connector which can be fixed in a stable way without increasing its physical size, which prevents connector terminals from rising and removing the underlying printed circuits from the substrate when an external force is applied on the connector housing or on a flat flexible cable.

It is another object of the present invention to provide a flat flexible cable connector exhibiting stable attachment to an associated printed circuit board in use and requiring no extra manufacturing steps and hence cost for installation.

Still another object of the present invention is to provide a miniaturized flat flexible cable connector which is adapted to overlie printed circuits on a printed circuit board and which requires no extra surface area surrounding the printed circuits for mounting the housing to the board, thereby permitting fulluse of the printed circuit board area for containing desired circuit patterns.

In accordance with the present invention, a new and improved connector arrangement for electrically connecting printed circuits on a printed circuit board to another circuit member is provided. The arrangement includes a printed circuit board having a plurality of printed circuits defined thereon. Each circuit has an associated solder contact pad. The arrangement also includes an electrical connector including a dielectric housing having a plurality of terminal receiving cavities. The housing has a circuit board engaging surface and a plurality of electrical terminals are mounted in cavities of the housing. Each terminal includes a board contact portion adapted to contact the solder pad. In addition, temporary hold down means are provided on the board engaging surface of the housing to temporarily hold the housing in position overlying the circuits preparatory to permanent soldering, such as by vapor phase reflow soldering methods.

In accordance with the present invention, each circuit on the printed circuit board is provided with at least two spacedapart solder contact pads having excess solder material thereon. Each terminal mounted in the connector housing includes at least two spaced-apart board contact portions adapted to engage said contact pads depending from the board engaging surface. The board contact portions and the solder contact pads interconnect upon reflow of said soldering material to provide a balanced mechanical attachment of the connector to the printed circuit board and electrical connection between the terminals and the printed circuits.

In accordance with the present invention, it has been discovered that adequate mechanical attachment of the connector to the board is provided by the double mechanical and electrical engagement between each terminal and each circuit provided in the arrangement. No further mounting means for permanently retaining the connector to the board surface are required. The assembled connector arrangment exhibits effective shock resistance and the tendency to remove portions of printed circuitry provided on the substrate by the prior art surface mount connector arrangments having an offset single solder point is avoided.

In accordance with the present invention, the new and improved miniaturized connectors of this invention have a width which does not substantially exceed the width of the flat flexible cable and the targeted printed circuitry. No additional mounting flanges are required, so that the miniaturized connector takes up far less printed circuit board surface area.

In the preferred embodiment, a connector arrangement for flat flex cable to board applications is provided wherein a second contact portion of each of the terminals disposed within the connector housing is adapted for electrical engagement with exposed conductors of a flat flex cable member.

Other objects and advantages of the present invention will become apparent from the following detailed description of the preferred embodiment, with reference to the drawings in which.

DETAILED DESCRIPTION OF THE PREFERRED EMBODIMENT

Figure 1:
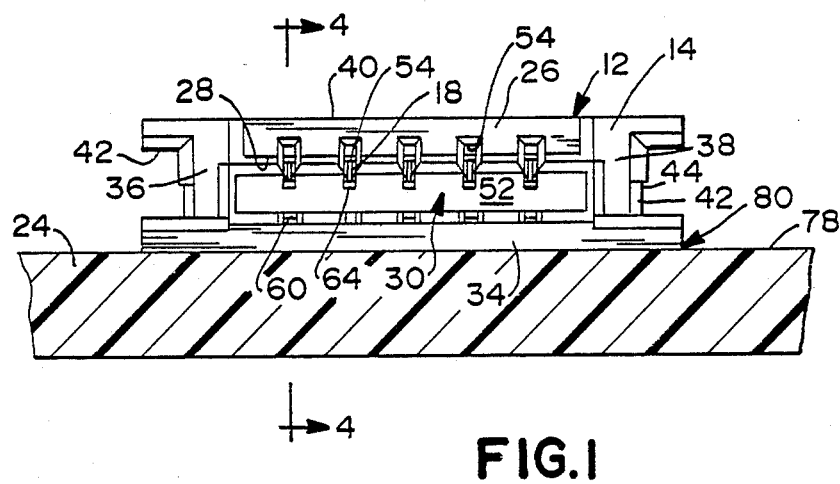
FIG. 1 is a front elevation view of the connector housing shown mounted on a printed circuit board.

In accordance with the present invention, an improved connector arrangement for connecting individual conductors in a flat flexible cable to individual circuits on a printed circuit board is provided. The connector arrangement is generally referred to by the reference numeral 10 in FIGS. 10 and 11. In general, connector arrangement 10 includes a connector 12 including a dielectric housing member 14 and a separate actuator member 16. A plurality of terminals 18 mounted in the connector housing 14 are in turn mounted to solder-bearing contact pads 20 associated with printed circuits 22 on a printed circuit board 24.

Referring now to FIGS. 1-4 the connector arrangement 10 firstly comprises a unitary integrally molded dielectric housing member 14. Connector housing 14 includes a front end 26 with an opening 28 and a socket 30 adapted to receive a flat flex cable 32 (FIG. 8) and actuator 16. Socket 30 extends rearwardly in the housing from the front opening 28 in the front end 26 to a rear surface 52. Socket 30 is further defined by a bottom wall 34, spaced opposed upstanding side walls 36, 38 and an opposing top wall 40. The opposed upstanding sidewalls 36 and 38 each include an actuator groove 42 on the outer surfaces thereof which further include a preload latch projection 44 and a spaced locking retainer projection 46 adapted to cooperate with resilient latch arms 48, 50 (FIGS. 5-6) provided on the actuator member 16, to be more particularly described below.

Connector housing 14 includes a plurality of spaced terminal receiving cavities 54 extending along the length of the socket 30. A plurality of stamped metal electrical terminals 18 are mounted in each cavity 54 in a press fit engagement.

Figure 2:
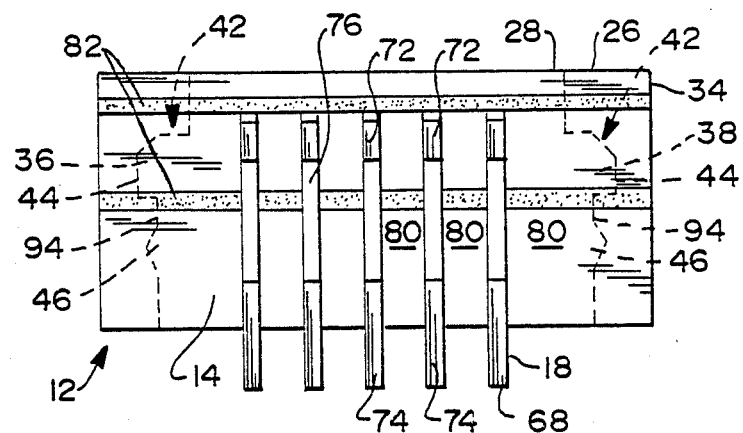
FIG. 2 is a bottom plan view of the board engaging surface of the connector housing.
Figure 3:
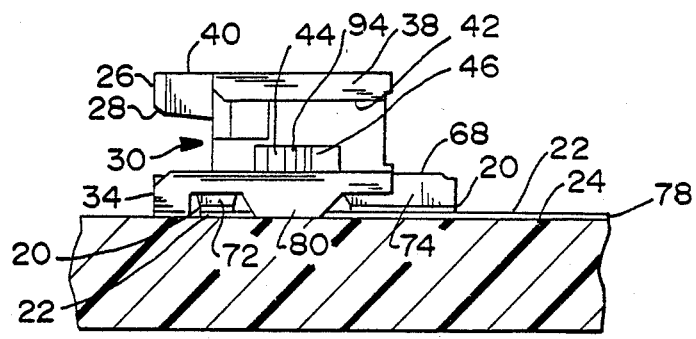
FIG. 3 is a side elevation view of the mounted connector housing taken from the right side as shown in FIG. 1.
Figure 4:
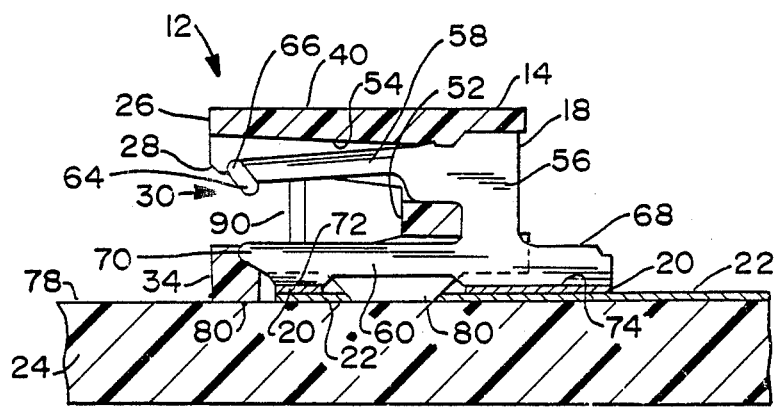
FIG. 4 is an elevated cross sectional view of the board mounted connector taken along view line 4—4 in FIG. 1.
Figure 12:
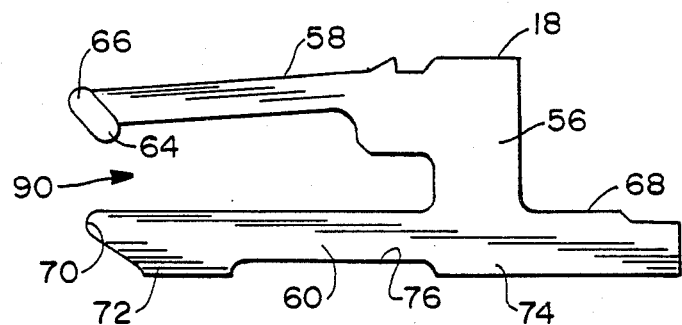
FIG. 12 is an elevated side view of the new and improved terminals for use in the connector arrangement of this invention.

The electrical terminals 18 are shown more particularly in FIG. 12. As shown therei, each terminal 18 is integrally formed from a metallic stamping to include a vertically extending base portion 56 and having forwardly projecting, spaced cantilever arms or beams 58, 60 extending unitarily from opposed sides of base 56 to a free end. The upper arm 58 is adapted to make resilient electrical contact with a bared conductor 62 of a cable 32 at a conductor contact portion 64 disposed at the free end 66 of the upper cantilever beam 58. A printed circuit board contact portion 68 extends rearwardly from the base 56 in alignment with the lower cantilevered beam 60. Disposed at the forward end 70 of the lower cantilever beam 60 is a solder contact projection 72 which is disposed in alignment with a solder contact projection 74 depending from the rearwardly extending board contact portion 68 of the terminal 18. As shown in FIG. 2, the lower surface 76 of the metallic terminal 18 disposed between the spaced apart solder projections 72, 74 is elevated from the surface of the printed circuit board.

The connector housing 14 includes a board engaging surface 80 shown in FIG. 2. Board engaging surface 80 is preferably provided with a strip of pressure sensitive adhesive 82, typically an epoxy based material, to temporarily attach the connector housing 14 with terminals 18 in position on printed circuit board 24, so that solder contact projections 72 and 74 of each terminal 18 engage each solder-bearing contact pad 20 of each printed circuit 22 prior to vapor phase reflow or other permanent soldering operation.

Figure 5:
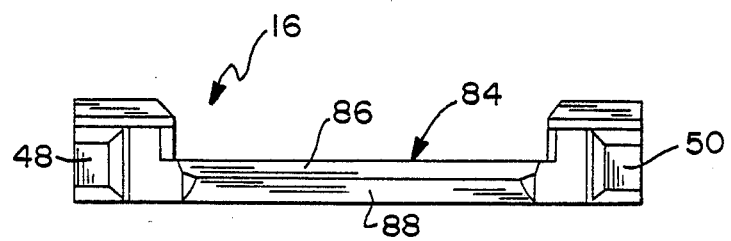
FIG. 5 is a front elevation view of the actuator member for use with the connector housing of the present invention.
Figure 6:
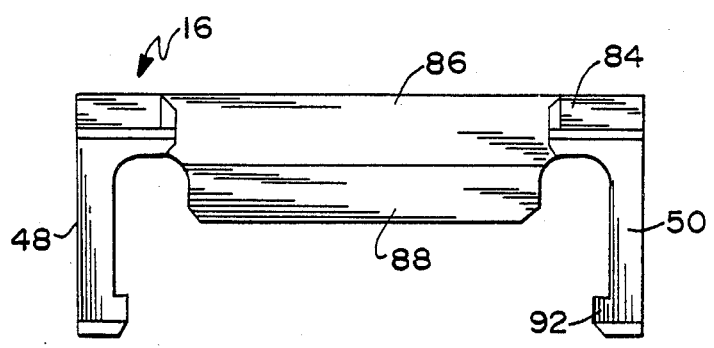
FIG. 6 is a top plan view of the cable actuator shown in FIG. 5.
Figure 7:
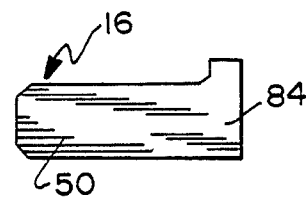
FIG. 7 is a side elevation view taken from the right side of the connector actuator shown in FIG. 5.

The connector housing 14 is adapted to cooperate with a cable actuator 16 shown in FIGS. 5, 6 and 9-11. As shown in FIGS. 5 and 6, cable actuator 16 comprises a elongate base 84 extending the width of the connector housing. A forwardly extending cable support projection 86 extends from the base 84 including a beveled nose portion 88. In addition, a pair of resilient latch arms 48 and 50 extend from the opposed ends of the base 84 on the same side as the forward cable supporting projection 86. The actuator 16 is adapted to be fitted into the front end 26 of the connector housing 14 in either the preload position shown in FIGS. 9 and 10 or in the fully mated position shown in FIG. 11.

Figure 9:
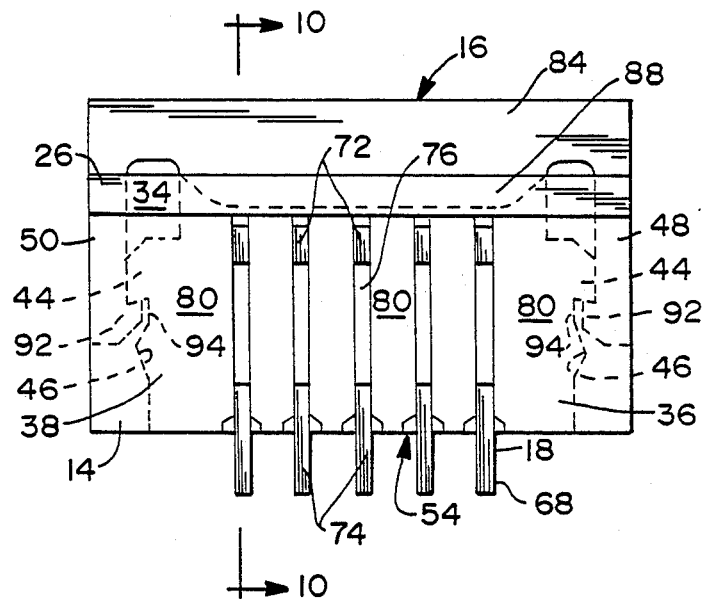
FIG. 9 is a bottom plan view of the connector and actuator in the first preload position ready to receive the flat flex cable.
Figure 10:
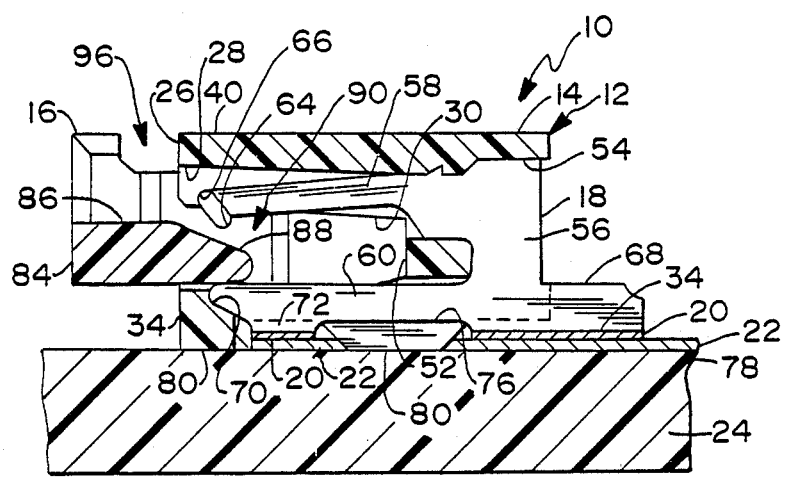
FIG. 10 is an elevated cross-sectional view of the connector arrangement in the preload state taken along lines 10—10 in FIG. 9.

As shown in FIGS. 9 and 10 the preload position of the actuator 16 is achieved when the actuator 16 is moved towards the front end 26 of the connector housing 14 so that the projecting nose portion 88 of the actuator 16 is received within the socket 30 and within the insertion slot 90 defined between the spaced upper and lower cantilever beams 58 and 60 of the metallic terminals 18.

As shown in FIG. 9, this position is achieved by outwardly deflecting the resilient latch arms 48 and 50 over the pre-load latch projections 44 on the housing 16 until the latch wings 92 on latch arms 48 and 50 are received within a first preload recess 94 in the actuator slide grooves 42 on the outside surfaces of sidewalls 36 and 38.

Figure 8:
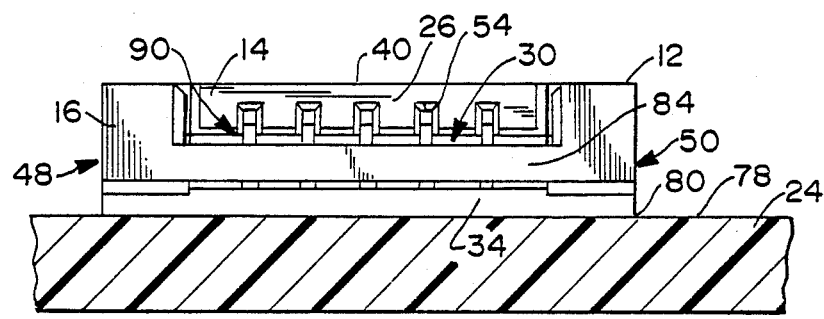
FIG. 8 is a front elevation view of the board mounted connector housing with the cable actutor positioned thereon in a pre-load position ready to accept a pre-stripped cable.
Figure 8:
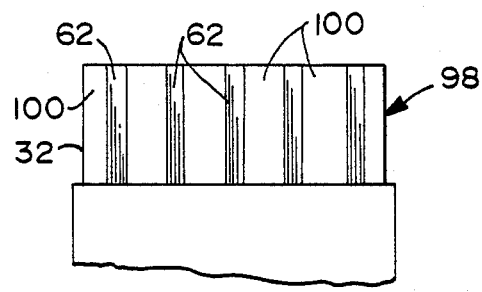

As shown in FIG. 10 in the preload position of the actuator 16, an insertion space 96 is provided between the actuator 16 and top wall 40 for receiving a prestripped end portion 98 of a flat flex cable 32 shown in FIG. 8. The prestripped cable end portion 98 includes a lower insulating web 100 and the upwardly facing exposed conductor portions 62. The top layer of insulation of the cable has been removed to expose the cable conductors 62.

The exposed end portion 98 is inserted into the insertion space 96 shown in FIG. 10 so that the bottom insulating web 100 is disposed on the upper surface of the beveled nose portion 88 with the exposed cable conductors 62 facing the cable conductor contact portions 64 disposed on the free ends 66 of the upper cantilever beams 58.

Figure 11:
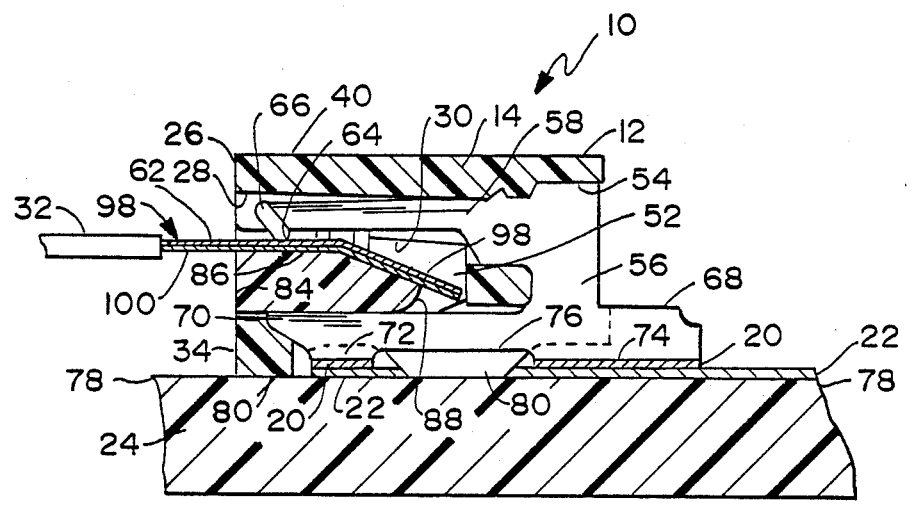
FIG. 11 is a similar elevated cross-sectional view of the connector arrangement similar to the view shown in FIG. 10 illustrating the fully mated condition of the connector arrangement.

With the conductors 62 inserted in to the socket 30, the actuator is urged inwardly towards the connector housing to the fully mated position shown in FIG. 11. As shown in FIG. 11, the nose projection 88 is moved forwardly into the socket 30 so that resilient electrical contact is made between contacts 64 on upper contact beams 58 and the exposed conductors 62, along the level surface of the cable support portion 86 beyond the beveled nose portion 88. The underside surface of the cable support portion 86 of the actuator 16 engages the lower cantilever beam 60 of the connector terminals 18.

As can be appreciated from FIG. 9, as the actuator 16 is moved from the preload position shown therein, to the fully mated position shown in FIG. 11, the resilient wings 92 are once again resiliently deflected over the locking retainer projections 46 to retain the electrical cable 32 in mated relationship to the electrical terminals 18 of the housing 18. This mated position will be maintained, until a sufficient withdrawal force is applied on the actuator 16 to overcome the resistance of the locking retainer projections 46 on the resilient latch arms 48 and 50 in the side grooves 42 on the housing.

In accordance with the present invention, a minor amount of a pressure sensitive adhesive 82 is applied to the board engaging surface 80 of the connector housing 14 as shown in FIG. 2 to temporarily attach connector housing 14 in the proper position over the contact pads 20 on the printed circuit board 24 perparatory to reflow soldering. In accordance with the present invention, the connector terminals 18 are mounted in the rear end of connector housing 14 and connector housing is positioned by means of the adhesive strip over the footprint of conductive solder pads 20 and associated circuits 22 provided on the upper surface 78 of the printed circuit board 24 as shown in FIG. 1.

A plurality of connectors 12 may be temporarily mounted onto the surface 78 of the circuit board 24 at appropriate locations by, for example, robotic arm placement and thereafter the entire circuit board assembly may be moved into a vapor phase reflow chamber to cause the excess solder provided on the solder pad contacts 20 to flow forming a mechanical and electrical connection between the stamped metallic terminals 18 and the printed circuits 22 of the printed circuit board 24. Thereafter, the actuator 16 may be assembled on to the connector housing 14 in its preload position. The overall arrangement is ready to receive the prestripped end 90 of a flat flex cable 32 to connect the individual conductors 62 thereof to the printed circuits 22.

In accordance with the present invention, the connector housing 14 may now be molded in a miniaturized form. The housing 14 needs only be as large as is required to overlay the printed circuits 22 on the substrate 24 and provide effective electrical insulation between the stamped metallic terminals 18. Very close center to center spacings may therefore be accommodated. Housing 24 has no side flange projecting portions, as there are in the prior art connectors for mounting the connectors to the board. The connector 12 is directly vertically positioned on the board and then soldered in place without requiring extra board real estate. As a result, the connector arrangement is well suited for use in high circuit density circuit board arrangements.

The provision of the redundant spaced apart solder connections per circuit provides effective electrical and mechanical engagement for each terminal and circuit. The cumulative effect of having two mechanical solder joints attaching the terminals, and therefore the housing, to the board surface is effective to provide a substantially shock-resistant surface mounted connector arrangement capable of withstanding the strain of repeated mating and unmating in use.

Only a minor amount of adhesive is used to temporarily retain the connector on the board in position for reflow. Increasing the amount of adhesive is not advantageous because the cost of the overall connector arrangement is increased. Excess adhesive may tend to interfere with the formation of a good reflow solder joint between the solder projections 72 and 74 and the solder contact pads 20 provided on the upper surface 78 of the printed circuit board 24 during reflow.

Although the present invention has been described with reference to an arrangement for electrically connecting individual conductors of a flat flexible circuit member to printed circuits on a printed circuit board, other contact configurations for engaging different circuit members may be used. All that is required is that the terminal include at least two surface mountable solder projections depending from the board engaging surface of the connector housing which are appropriately balanced to the remainder of the connector housing to effectively mount the housing on the board upon reflow and resist the shocks caused by actuating an actuator or other aspects of mating.

In summary, the present invention provides a new and improved surface mount connector arrangement for mounting a multicircuit connector to a printed circuit board and for electrically connecting the terminals mounted in the connector to printed circuits on the printed circuit board. Costly drilling of the printed circuit board or extra molding steps to provide mounting projections for attachment of the connector on the board are no longer required. These features facilitate robotic placement and vapor phase reflow operations in a cost effective, miniaturized manner.

Although the present invention has been described with reference to a preferred embodiment, modifications and changes may be made by those skilled in the art without departing from the scope or spirit of the present invention as defined by the appended claims.

We claim:

1. A surface-mount connector arrangement for electrically connecting printed circuits defined on a surface of a printed circuit board to another circuit member, said arrangement comprising:

a printed circuit board having a surface and a plurality of printed circuits defined on said surface, each of said printed circuits including a pair of spaced solder contact pads having a reflowable amount of solder material thereon; and an electrical connector including a dielectric housing having a plurality of terminal-receiving cavities and a board-engaging surface; a plurality of electrical terminals mounted in said cavities, each terminal including a pair of spaced surfacemount board contact portions disposed adjacent the board-engaging surface of the housing and spaced apart by a corresponding spacing to said solder contact pads; and hold down means for retaining the board-engaging surface in position on the printed circuit board preparatory to a permanent soldering treatment;

said connector positioned on said printed circuit board surface so that each of said surface mount contact portions engages a solder contact pad and both of said surface mount board contact portions and said solder pads interconnect upon reflow of the solder material to provide a redundant electrical connection between each terminal and each circuit and a balanced mechanical attachment of the connector to the printed circuit board.

2. An arrangement as in claim 1, wherein said another circuit member comprises conductors in a flat flexible cable and each of said terminals further includes a cable conductor contact portion in said housing for electrically engaging a conductor in said cable.

* * * * *